Sept. 20, 1966 S. PESSOK 3,274,455

CONTACT FOR SOLID STATE DIODE

Filed July 27, 1962

INVENTOR.
STANLEY PESSOK

BY James and Franklin

ATTORNEYS

United States Patent Office 3,274,455
Patented Sept. 20, 1966

3,274,455
CONTACT FOR SOLID STATE DIODE
Stanley Pessok, West Orange, N.J., assignor to General Instrument Corporation, Newark, N.J., a corporation of New Jersey
Filed July 27, 1962, Ser. No. 212,933
3 Claims. (Cl. 317—234)

This invention relates to semiconductors, especially silicon junction diodes, and more particularly to an improved structure for providing surface contact.

Silicon diodes sealed in very small glass cylinders have come into wide use. The silicon junction and its lead are sealed in one end of the cylinder and a contact spring and its lead are sealed in the other end of the cylinder, the spring being a slender strip of resilient metal usually bent to S shape. To achieve certain desirable electrical characteristics, high frequency operation, for example, it is necessary to reduce the dimensions of the junction, thereby reducing the area available for contact by the S-bend. This creates a structural problem in that the S spring then must be in good alignment with the cylinder if it is to bear properly on the contact surface of the mesa. The height of the contact area relative to the surrounding region may be very slight, say only one or two thousandths of an inch, and any misalignment of the spring may result in contact with the surrounding area instead of the desired raised contact surface.

The general object of the present invention is to overcome the foregoing difficulties, and to simplify the manufacture of such diodes.

To accomplish the foregoing general object, and other more specific objects which will hereinafter appear, my invention resides in the surface contact diode elements, and their relation one to another, as are hereinafter more particularly described in the following specification. The specification is accompanied by a drawing in which.

Figure 1:
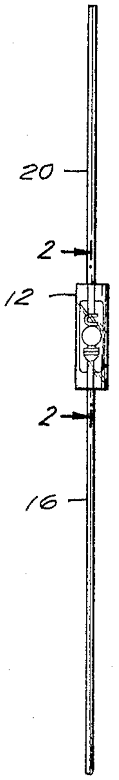
FIG. 1 shows a glass diode embodying the present improvement.
Figure 2:
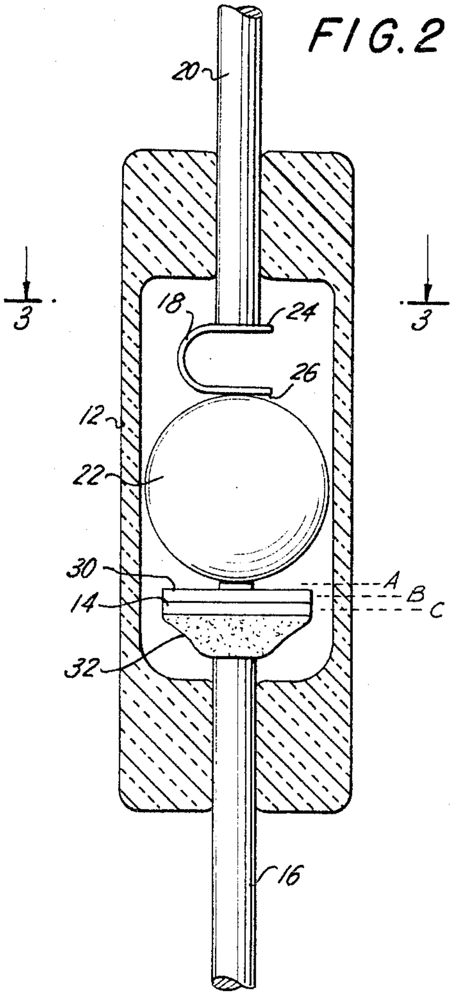
FIG. 2 is a section drawn to enlarged scale and taken approximately in the plane of the line 2—2 of FIG. 1.
Figure 3:
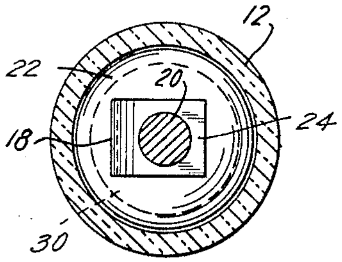
FIG. 3 is a transverse section taken approximately in the plane of the line 3—3 of FIG. 2.

Referring to the drawing, and more particularly to FIG. 2, the diode there shown comprises a cylindrical glass envelope 12 having a semiconductor junction generally designated 14 and its lead 16 sealed in one end of the cylinder. There is also a contact spring 18 and its lead 20 sealed in the other end of the cylinder. A metal sphere 22 is disposed directly between the spring 18 and the top surface of the junction 14.

The junction 14 is preferably a silicon junction of the mesa type. The silicon was previously treated or diffused with one or another of the known impurities to make the junction either P type or N type. The junction may be considered to have three levels marked A, B, and C. In one case the part A will be of the P type, the part B of the N type, and the part C of the N+ type. In the other case the part A will be of the N type, the part B of the P type, and the part C of the P+ type.

Other semiconductor metals may be used, but silicon has the advantage of withstanding relatively high temperature. It may be operated in a high ambient temperature, or for a particular ambient temperature may be operated at high current value. This is accomplished while keeping the unit very small in dimension, and therefore suitable for very high frequency work. In the illustrated diode the glass cylinder 12 has a length of only about one quarter of an inch.

The sphere 22 is made of a conductive and preferably light weight metal. Aluminum is satisfactory, and these tiny balls of aluminum are already commercially available for other purposes. The ball might be made of nickel or silver or a lead-silver alloy. A light weight metal is preferred because if the diode is subjected to serious vibration, a heavy metal may cause reduced contact because of its inertia.

It will be noted in the drawing that the sphere 22 has a diameter closely approaching the inside diameter of the cylinder. This is desirable because it results in automatic alignment of the contact between the ball and the top surface of the mesa.

The spring 18 is a strip of metal bent to U shape. One outer side 24 is secured to the inner end of the lead 20, and the other outer side 26 bears against the sphere 22. The spring may be made and secured to the lead with considerable tolerance. It does not require perefect alignment nor perfect configuration, because its contact is not with the top surface of the junction, but only with the ball 22, and the latter is held in proper alignment because of its spherical shape and its confinement within the glass cylinder.

The height of the part A of the contact area may be very small, say only one or two thousandths of an inch. This has led to difficulty when using an S spring because any slight misalignment or inaccuracy would permit the lower surface of the spring to touch the surrounding surface 30 of the mesa. That difficulty is overcome when using the contact ball 22.

The lead wires 16 and 20 are preferably Dumet leads. Although less desirable, the leads may be made of molybdenum, Kovar, Rodar, or platinum, or other metals known to be suitable for sealing into glass.

The junction 14 is secured to the lead 16 in conventional fashion, as by means of solder indicated at 32. The silicon may be plated to hold the solder, as is known. The junction may be of different character and with more layers than are here shown. It might for example have P, N, P and N layers, instead of the simpler P and N layers here shown. It might also be not of the mesa type but nonetheless having a small contact area raised above the surrounding area.

The semiconductor used is preferably silicon, but the ball contact may be applied to other semiconductors, for example germanium, which however must be operated at a much lower temperature, or gallium arsenide which may be operated at higher temperature.

The spring 18 may be made of any of the materials heretofore used for such surface contact springs, typically an alloy of platinum or of tungsten. Although the spring has been shown in U shape, it might also be made, though less compactly, in S shape, the ball then being located below the bottom of the S spring. Other shapes also can be used.

The actual construction and assembly of the diode is simplified, it being an easy step to drop the ball 22 into position, compared to seeking perfect alignment and contact of an S bent spring. This is so because the lowest point of the sphere is always at the center of the cylinder. Moreover, the sphere has a relatively large radius of curvature and therefore any small error in alignment is not critical.

It is believed that the construction of my improved glass diode, as well as the advantages thereof, will be apparent from the foregoing detailed description. It avoids the need for critical location and configuration of the spring. It is characterized by good resistance to vibration and by good thermal transfer properties.

It will be understood that although I have described my improved surface contact diode in a preferred form, changes may be made without departing from the scope of the invention, as sought to be defined in the following claims.

I claim:

1. A silicon junction diode comprising a cylindrical glass envelope, a semiconductor junction and lead sealed in one end of the cylinder, a contact spring and lead sealed in the other end of the cylinder, and a metal sphere formed of a metal of no greater weight than a metal selected from the group consisting of aluminum, nickel, silver or lead-silver alloy disposed directly between the spring and the surface of the junction, said sphere having a diameter closely approaching the inside diameter of the cylinder, there being no metal band to the ball, and said junction being a silicon junction of the mesa type with a centrally located mesa.

2. A surface contact diode comprising a cylindrical glass envelope, a semiconductor junction and lead sealed in one end of the cylinder, a contact spring and lead sealed in the other end of the cylinder, and a metal sphere formed of a metal of no greater weight than a metal selected from the group consisting of aluminum, nickel, silver or lead-silver alloy disposed directly between the spring and the surface of the junction, said sphere having a diameter closely approaching the inside diameter of the cylinder, there being no metal band to the ball, and said spring being a strip of resilient metal bent to U shape, with one outer side of the U secured to the end of its lead, and the other outer side of the U bearing against the sphere.

3. A surface contact diode comprising a cylindrical glass envelope, a semiconductor junction and lead sealed in one end of the cylinder, a contact spring and lead sealed in the other end of the cylinder, and a metal sphere formed of a metal of no greater weight than a metal selected from the group consisting of aluminum, nickel, silver or lead-silver alloy disposed directly between the spring and the surface of the junction, said sphere having a diameter closely approaching the inside diameter of the cylinder, there being no metal band to the ball, said junction being a silicon junction of the mesa type with a centrally located mesa, and said spring being a strip of resilient metal bent to U shape, with one outer side of the U secured to the end of the lead, and the other outer side of the U bearing against the sphere.

References Cited by the Examiner

UNITED STATES PATENTS

| | | | |
|---|---|---|---|
| 1,908,800 | 5/1933 | Utne | 317—234 |
| 2,671,189 | 3/1954 | Gaudlitz | 317—235 |
| 2,728,881 | 12/1955 | Jacobi | 317—235 |
| 2,888,618 | 5/1959 | Lockett | 317—234 |
| 2,982,892 | 5/1961 | Bender | 317—234 |

JOHN W. HUCKERT, *Primary Examiner.*

J. D. KALLAM, *Assistant Examiner.*